United States Patent
Park et al.

(10) Patent No.: US 12,482,661 B2
(45) Date of Patent: Nov. 25, 2025

(54) SEMICONDUCTOR DEVICE HAVING DEUTERIUM DIFFUSED INTO THE SUBSTRATE AND METHOD OF MANUFACTURING THE SAME

(71) Applicant: SAMSUNG ELECTRONICS CO., LTD., Suwon-si (KR)

(72) Inventors: Hwanyeol Park, Seoul (KR); Sejun Park, Seoul (KR); Junhyoung Cho, Seoul (KR); Sejin Kyung, Seoul (KR); Daewee Kong, Yongin-si (KR); Taemin Kim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 536 days.

(21) Appl. No.: 17/899,832

(22) Filed: Aug. 31, 2022

(65) Prior Publication Data
US 2023/0081402 A1    Mar. 16, 2023

(30) Foreign Application Priority Data

Sep. 14, 2021    (KR) .................. 10-2021-0122772

(51) Int. Cl.
*H01L 21/30*    (2006.01)
(52) U.S. Cl.
CPC ................ *H01L 21/3003* (2013.01)
(58) Field of Classification Search
CPC . H01L 21/3003; H01L 21/326; H10B 12/315; H10B 12/50
USPC ......... 257/57, 208, 220, 278, 288, 296, 302, 257/328, 329, 331, 334, 350, 368, 369, 257/376, 377, 410, 618, 664, 666, 773, 257/774, 903; 438/33, 106, 197, 199, 438/210, 212, 239, 241, 243, 268, 308,
(Continued)

(56) References Cited

U.S. PATENT DOCUMENTS 8,067,313 B2   11/2011   Nakamura
8,865,573 B2   10/2014   Kwak
(Continued)

FOREIGN PATENT DOCUMENTS

JP    1995-066197 A     3/1995
KR    10-1999-0051418 A    7/1999
(Continued)

OTHER PUBLICATIONS

Taiwanese Office Action dated Jul. 12, 2023, for the corresponding TW Patent Application No. 111134573.

*Primary Examiner* — Eva Y Montalvo
*Assistant Examiner* — Nicholas B Michaud
(74) *Attorney, Agent, or Firm* — Muir Patent Law, PLLC

(57) ABSTRACT

A method of manufacturing a semiconductor device includes preparing a substrate including cell regions and a scribe lane region, forming circuit blocks in the cell regions of the substrate, the substrate including a first surface and a second surface, forming a bias pad on the first surface of the substrate, such that the bias pad is in the scribe lane region of the substrate, bonding a deuterium exchange structure to the second surface of the substrate, implanting deuterium into the deuterium exchange structure using plasma processing, and applying a first voltage to the bias pad, such that the deuterium is diffused from the deuterium exchange structure into the substrate through the second surface of the substrate.

20 Claims, 18 Drawing Sheets

(58) Field of Classification Search
USPC ....... 438/462, 465, 466, 468, 471, 474, 475,
438/476, 478, 480, 520, 589, 597, 623,
438/714, 766, 773, 785, 795, 798
See application file for complete search history.

(56) References Cited

U.S. PATENT DOCUMENTS

| | | |
|---|---|---|
| 9,917,091 B2 | 3/2018 | Kugimiya et al. |
| 10,559,569 B2 | 2/2020 | Jang et al. |
| 10,566,284 B2 | 2/2020 | Kim et al. |
| 11,024,812 B2 | 6/2021 | Jang et al. |
| 11,024,882 B2 | 6/2021 | Kawasumi et al. |
| 11,024,884 B2 | 6/2021 | Wang |
| 2003/0017682 A1* | 1/2003 | Saino .................... H10B 12/05 |
| | | 257/E21.654 |
| 2008/0128833 A1 | 6/2008 | Kawahara et al. |
| 2014/0024201 A1* | 1/2014 | Kwak .................. H01L 21/322 |
| | | 438/476 |
| 2017/0263966 A1 | 9/2017 | Lozada et al. |
| 2017/0345772 A1* | 11/2017 | Jackson ................ H01L 21/78 |
| 2018/0311624 A1* | 11/2018 | Lozada ................. B01D 59/14 |

FOREIGN PATENT DOCUMENTS

| | | |
|---|---|---|
| KR | 10-0842507 B1 | 7/2008 |
| KR | 10-2008-0110119 A | 12/2008 |
| KR | 10-2012-0060529 A | 6/2012 |
| KR | 10-2016-0001114 A | 1/2016 |
| TW | 200629420 A | 8/2006 |

\* cited by examiner

SEMICONDUCTOR DEVICE HAVING DEUTERIUM DIFFUSED INTO THE SUBSTRATE AND METHOD OF MANUFACTURING THE SAME

CROSS-REFERENCE TO RELATED APPLICATION

This application is based on and claims priority under 35 U.S.C. § 119 to Korean Patent Application No. 10-2021-0122772, filed on Sep. 14, 2021, in the Korean Intellectual Property Office, the disclosure of which is incorporated by reference herein in its entirety.

BACKGROUND

1. Field

Example embodiments relate to a semiconductor device and a method of manufacturing the same, and more particularly, to a method of manufacturing a semiconductor device by using deuterium implantation to prevent a substrate defect and a semiconductor device manufactured using the method.

2. Description of the Related Art

With the down-scaling of semiconductor devices, the size of transistors in semiconductor device decreases. As a transistor having a small size is formed in a semiconductor substrate, a threshold voltage change in the transistor or leakage current because of dangling bonds on the surface of a silicon substrate may occur.

SUMMARY

According to an aspect of example embodiments, there is provided a method of manufacturing a semiconductor device. The method includes forming a plurality of circuit blocks in a cell region of a substrate including the cell region and a scribe lane region, the substrate including a first surface and a second surface; forming a bias pad on the first surface of the substrate in the scribe lane region; bonding a deuterium exchange structure to the second surface of the substrate; implanting deuterium into the deuterium exchange structure using plasma processing; and diffusing the deuterium from the deuterium exchange structure into the substrate through the second surface of the substrate by applying a first voltage to the bias pad.

According to another aspect of example embodiments, there is provided a method of manufacturing a semiconductor device. The method includes forming a plurality of circuit blocks on a substrate including a first surface and a second surface; forming a bias pad on the first surface of the substrate; bonding a deuterium exchange structure to the second surface of the substrate, the deuterium exchange structure including a porous metal plate and a hydrogen ion exchange membrane on a top surface of the porous metal plate; implanting deuterium into the deuterium exchange structure using plasma processing; and diffusing the deuterium from the deuterium exchange structure into the substrate through the second surface of the substrate by applying a first voltage to the bias pad.

According to still another aspect of example embodiments, there is provided a method of manufacturing a semiconductor device. The method includes forming a plurality of circuit blocks on a substrate including a first surface and a second surface; forming a bias pad on the first surface of the substrate; bonding an ion exchange structure to the second surface of the substrate; diffusing impurities in the substrate from the second surface of the substrate into the ion exchange structure; removing the ion exchange structure; bonding a deuterium exchange structure to the second surface of the substrate; implanting deuterium into the deuterium exchange structure using plasma processing; and diffusing the deuterium from the deuterium exchange structure into the substrate through the second surface of the substrate.

According to yet another aspect of example embodiments, there is provided a semiconductor device including a substrate including a first surface, a second surface opposite to the first surface, a cell region, and a scribe lane region; a memory cell array on the first surface of the substrate in the cell region; and a bias pad on the first surface of the substrate in the scribe lane region, wherein the substrate has a first deuterium content, and the first deuterium content has a profile gradually decreasing from the second surface of the substrate toward the first surface of the substrate in a first direction that is perpendicular to the first surface of the substrate.

According to a further aspect of example embodiments, there is provided a semiconductor device including a substrate including a first surface, a second surface opposite to the first surface, a cell region, and a scribe lane region; a memory cell array on the first surface of the substrate in the cell region; and a bias pad on the first surface of the substrate in the scribe lane region, wherein the substrate includes deuterium, and a deuterium content in a portion adjacent to the second surface of the substrate is greater than a deuterium content in a portion adjacent to the first surface of the substrate.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
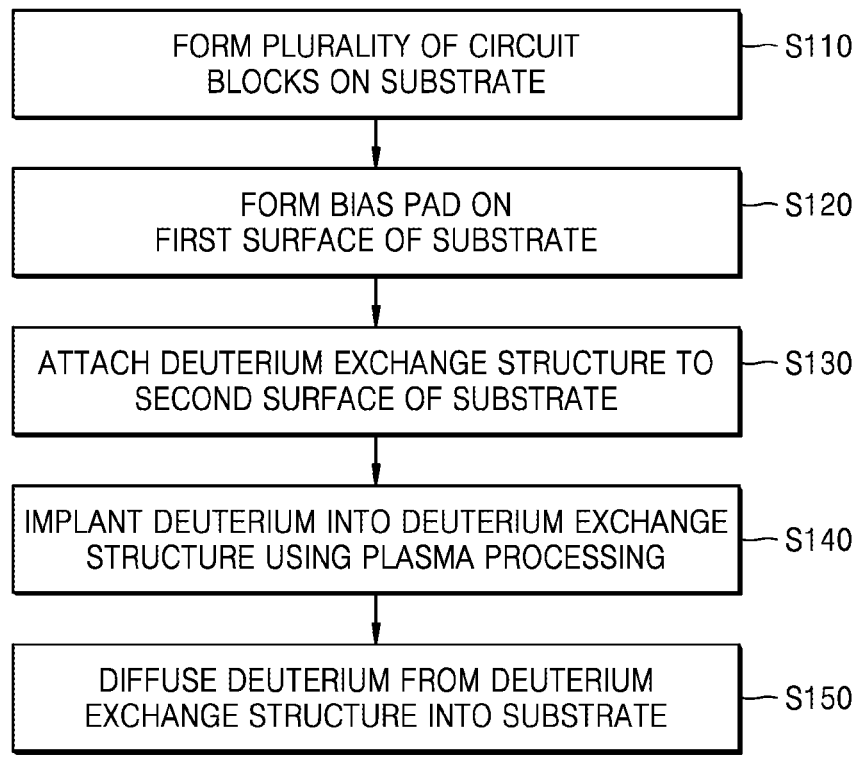
FIG. 1 is a flowchart of a method of manufacturing a semiconductor device, according to example embodiments.

FIG. 1 is a flowchart of a method of manufacturing a semiconductor device, according to example embodiments. FIGS. 2A, 2B, 3A, 3B, 4A, 4B, 5, and 6 are schematic diagrams of stages in the method of FIG. 1.

Figure 2A:
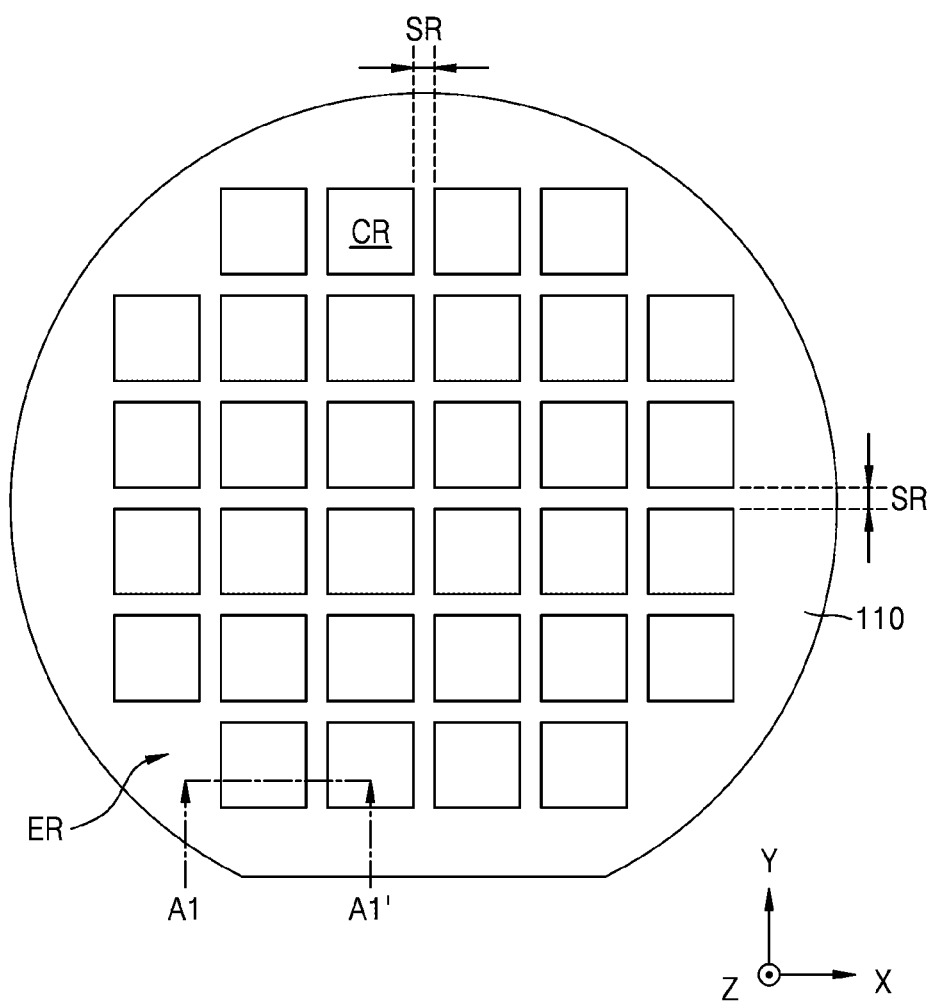
FIGS. 2A, 2B, 3A, 3B, 4A, 4B, 5, and 6 are schematic diagrams of stages in the method of FIG. 1.
Figure 2B:
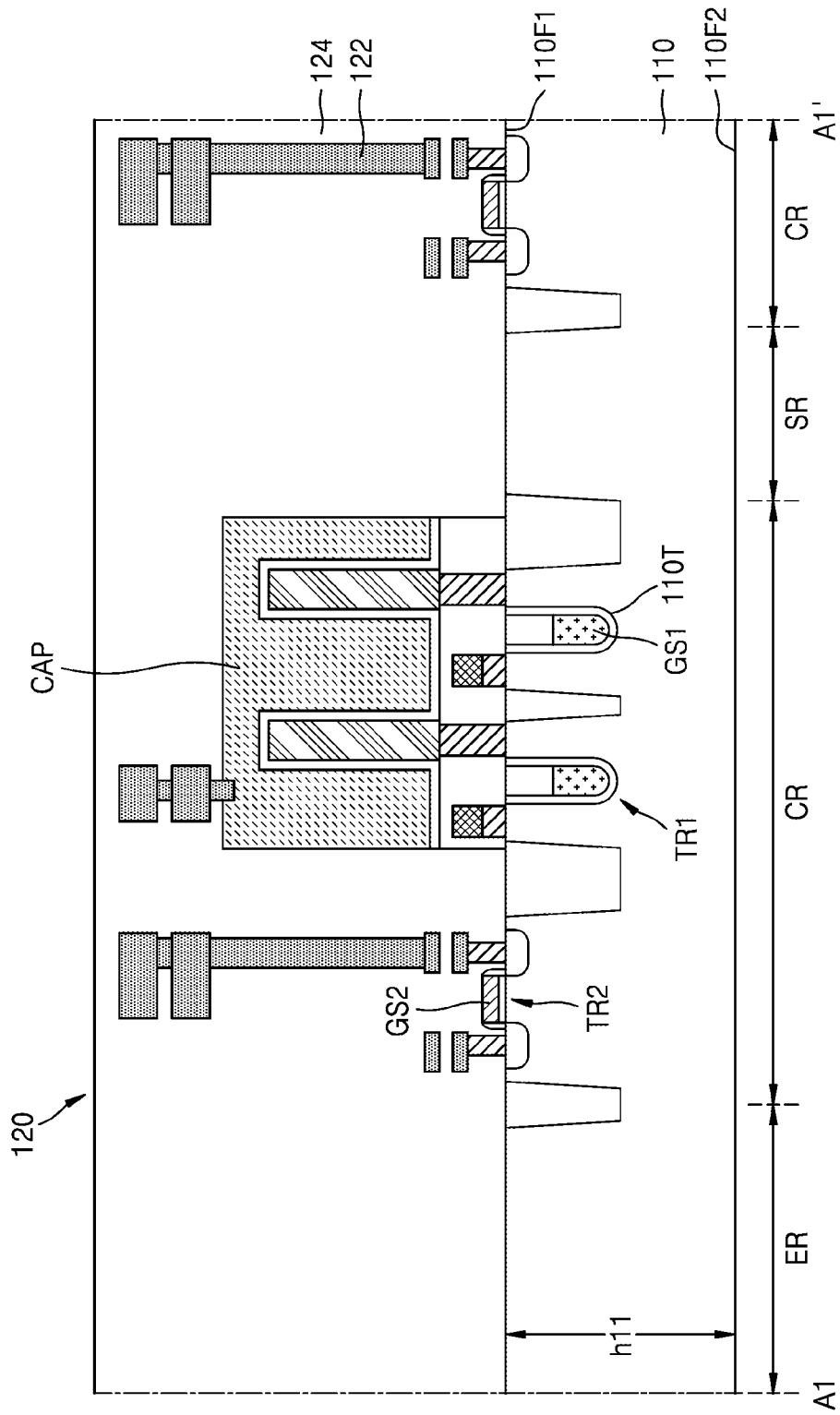

Referring to FIGS. 1, 2A, and 2B, a plurality of circuit blocks 120 may be formed on a substrate 110 in operation S110.

The substrate 110 may include a first surface 110F1 and a second surface 110F2 opposite to the first surface 110F1. The substrate 110 may have a first height h11 in a vertical direction that is perpendicular to the first surface 110F1 of the substrate 110. For example, the first height h11 may range from several tens of micrometers to several hundreds of micrometers.

The substrate 110 may include silicon, e.g., monocrystalline silicon, polycrystalline silicon, or amorphous silicon. In some embodiments, the substrate 110 may include at least one of, e.g., Ge, SiGe, SiC, GaAs, InAs, and InP. In some embodiments, the substrate 110 may include a conductive region, e.g., an impurity-doped well or an impurity-doped structure.

The substrate 110 may include cell regions CR, a scribe lane region SR, and an edge region ER. The circuit blocks 120 may be formed in the cell regions CR, e.g., one circuit block 120 may be formed in a corresponding cell region CR in a one-to-one correspondence. The scribe lane region SR may extend between two adjacent cell regions CR in a first direction X and a second direction Y, e.g., the scribe lane region SR may have a continuous grid pattern separating the cell regions CR into a two-dimensional matrix pattern. The edge region ER may correspond to a portion of the substrate 110 surrounding the cell regions CR in a plan view, e.g., the edge region ER may be a peripheral region continuously surrounding an entire perimeter of all the cell regions CR. The scribe lane region SR may undergo sawing in a subsequent process such that a plurality of cell regions CR may be singulated into respective semiconductor devices 100.

The circuit blocks 120 may be on the first surface 110F1 of the substrate 110. In example embodiments, the circuit blocks 120 may include, e.g., a dynamic random access memory (DRAM) device, a phase-change random access memory (PRAM) device, a resistive random access memory (ReRAM) device, a magnetic random access memory (MRAM) device, a static random access memory (SRAM) device, a NAND flash memory device, a logic circuit device, a complementary metal-oxide semiconductor (CMOS) image sensor, a neuromorphic computing device, or the like. For example, each of the circuit blocks 120 may include a first transistor TR1 and a second transistor TR2 on the first surface 110F1 of the substrate 110.

In example embodiments, the first and second transistors TR1 and TR2 may include, e.g., a planar transistor, a buried channel array transistor (BCAT), a fin field effect transistor (finFET), a gate-all-around (GAA) transistor, a vertical channel transistor, a multi-bridge channel (MBC) transistor, a negative capacitance transistor, or the like. For example, FIG. 2B illustrates a case in which the circuit block 120 includes a DRAM device, and the first and second transistors TR1 and TR2 correspond to a BCAT and a planar transistor, respectively, arranged on the first surface 110F1 of the substrate 110 in the cell region CR.

In detail, referring to FIG. 2B, the first transistor TR1 may correspond to a BCAT and include a first gate structure GS1 in a trench 110T, which extends into the substrate 110 from the first surface 110F1 of the substrate 110. The second transistor TR2 may correspond to a planar transistor and include a second gate structure GS2 on the first surface 110F1 of the substrate 110. A capacitor CAP, which is electrically connected to the first gate structure GS1, may be arranged on the first gate structure GS1.

In example embodiments, the first transistor TR1 and the capacitor CAP may form a memory cell array of the DRAM device. The second transistor TR2 may correspond to a peripheral circuit transistor, which transmits a signal and/or power to the memory cell array, and may form various circuits, e.g., a command decoder, a control logic, an address buffer, a row decoder, a column decoder, a sense amplifier, and a data input/output circuit.

In example embodiments, the circuit block 120 may further include a wiring layer 122 and an insulating layer 124 on the first surface 110F1 of the substrate 110. The wiring layer 122 may be electrically connected to the first transistor TR1, the capacitor CAP, and the second transistor TR2. The insulating layer 124 may be on the first surface 110F1 of the substrate 110 and cover the first transistor TR1, the capacitor CAP, the second transistor TR2, and the wiring layer 122.

In example embodiments, the wiring layer 122 may include, e.g., tungsten (W), cobalt (Co), copper (Cu), aluminum (Al), or a combination thereof. The insulating layer 124 may include, e.g., silicon oxide, silicon oxynitride, SiOC, SiOH, a low-k dielectric material, or a combination thereof.

Figure 3A:
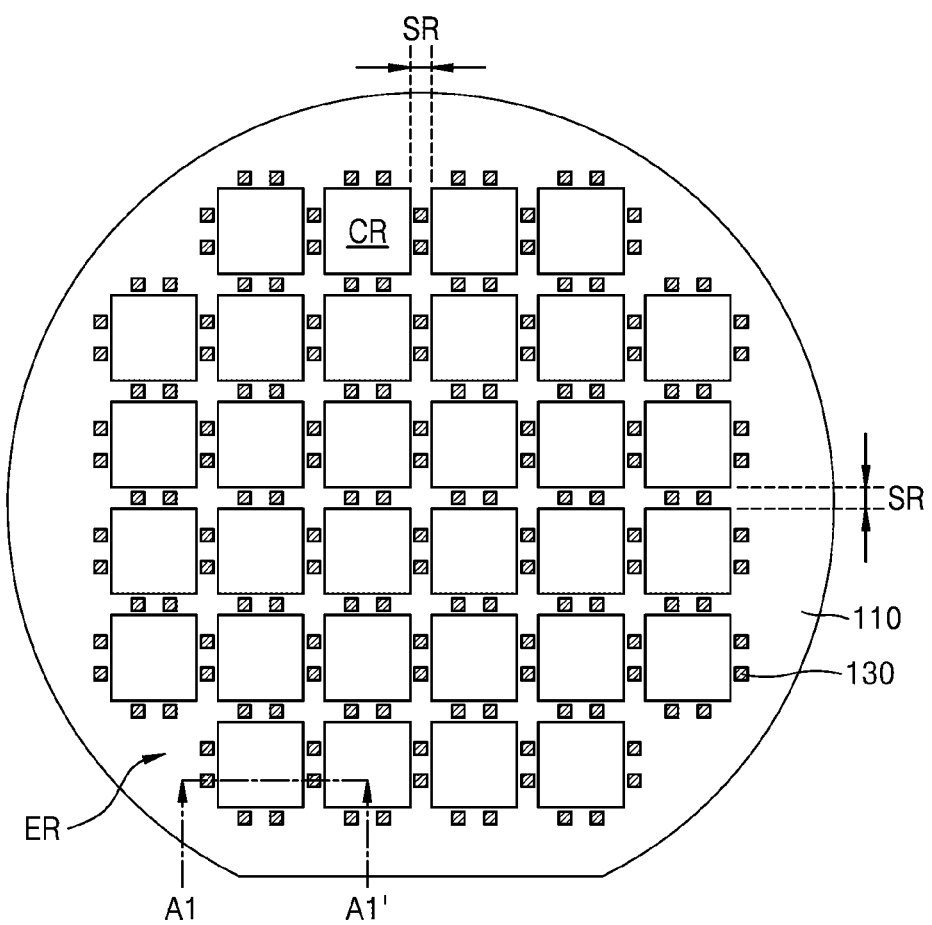
Figure 3B:
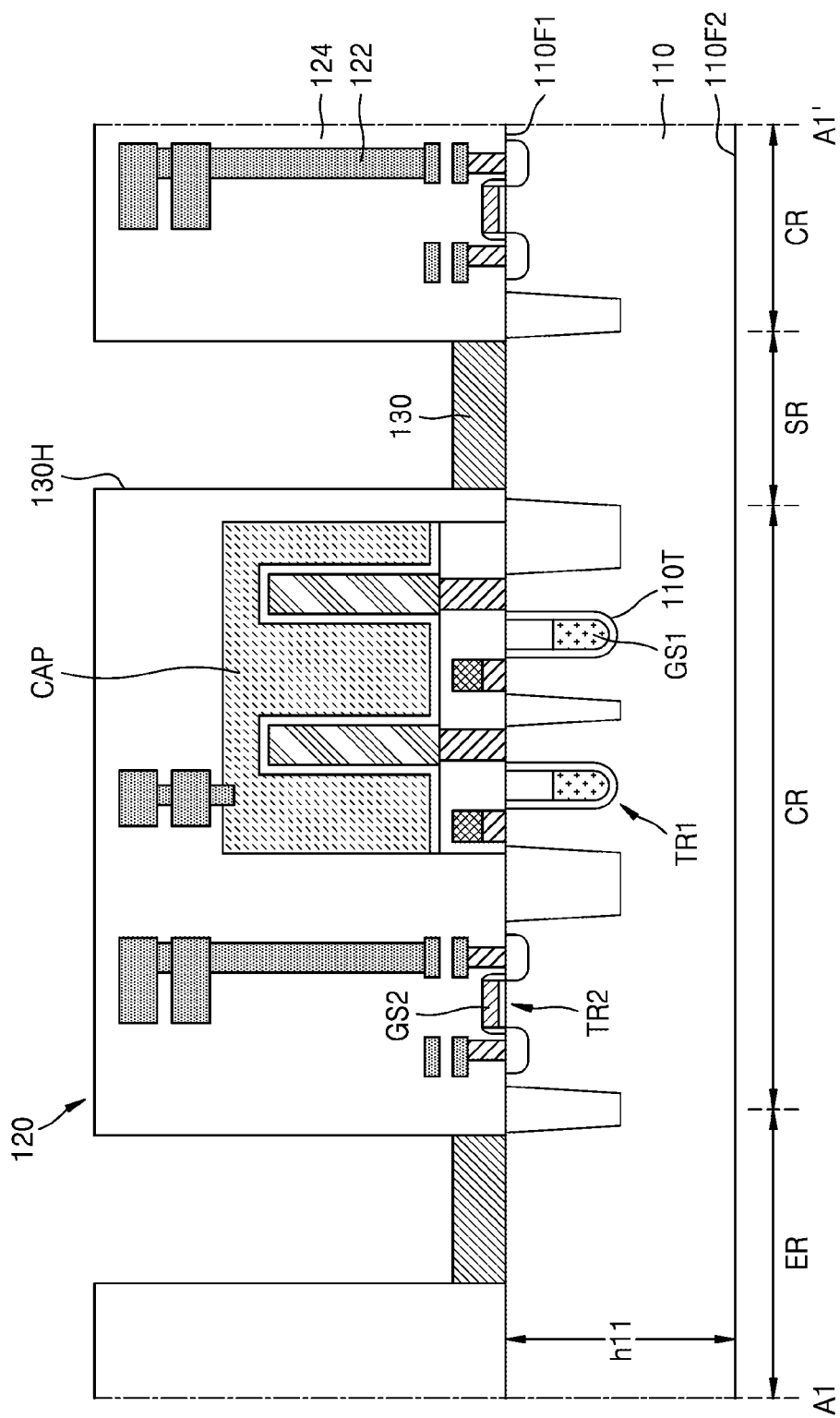

Referring to FIGS. 1, 3A, and 3B, a bias pad 130 may be formed on the first surface 110F1 of the substrate 110 in operation S120.

In example embodiments, the bias pad 130 may be arranged in the scribe lane region SR and/or the edge region ER of the substrate 110. For example, the bias pad 130 may be directly arranged on the first surface 110F1 of the substrate 110 in the scribe lane region SR.

In example embodiments, the bias pad 130 may be formed by forming an opening 130H in the insulating layer 124, such that the opening 130H exposes the first surface 110F1 of the substrate 110 in the scribe lane region SR., e.g., partially removing the insulating layer 124 to form the opening 130H. Then, a conductive material may be filled in a bottom portion of the opening 130H to form the bias pad 130.

In example embodiments, the bias pad 130 may include, e.g., a metal, a metal nitride, a metal silicide, or a combination thereof. For example, the bias pad 130 may include W, Co, Cu, Al, titanium nitride, tantalum nitride, cobalt silicide, nickel silicide, manganese silicide, or a combination thereof.

In some embodiments, the bias pad 130 may have a stack structure of a first material layer, a second material layer, and a third material layer. For example, the first material layer may include a metal silicide, the second material layer may include a metal nitride, and the third material layer may include a metal. In some embodiments, the bias pad 130 may have a stack structure of a first material layer and a second material layer. For example, the first material layer may include a metal nitride, and the second material layer may include a metal.

In a plan view, the bias pads 130 may be, e.g., uniformly, distributed in the scribe lane region SR to be spaced apart from each other by a certain distance. For example, a plurality of bias pads 130 may be arranged around the cell region CR at predetermined, e.g., regular, intervals in the plan view. The bias pad 130 may be in direct contact with the first surface 110F1 of the substrate 110, and an additional material may not be added or positioned between the bias pad 130 and the first surface 110F1 of the substrate 110.

Figure 4A:
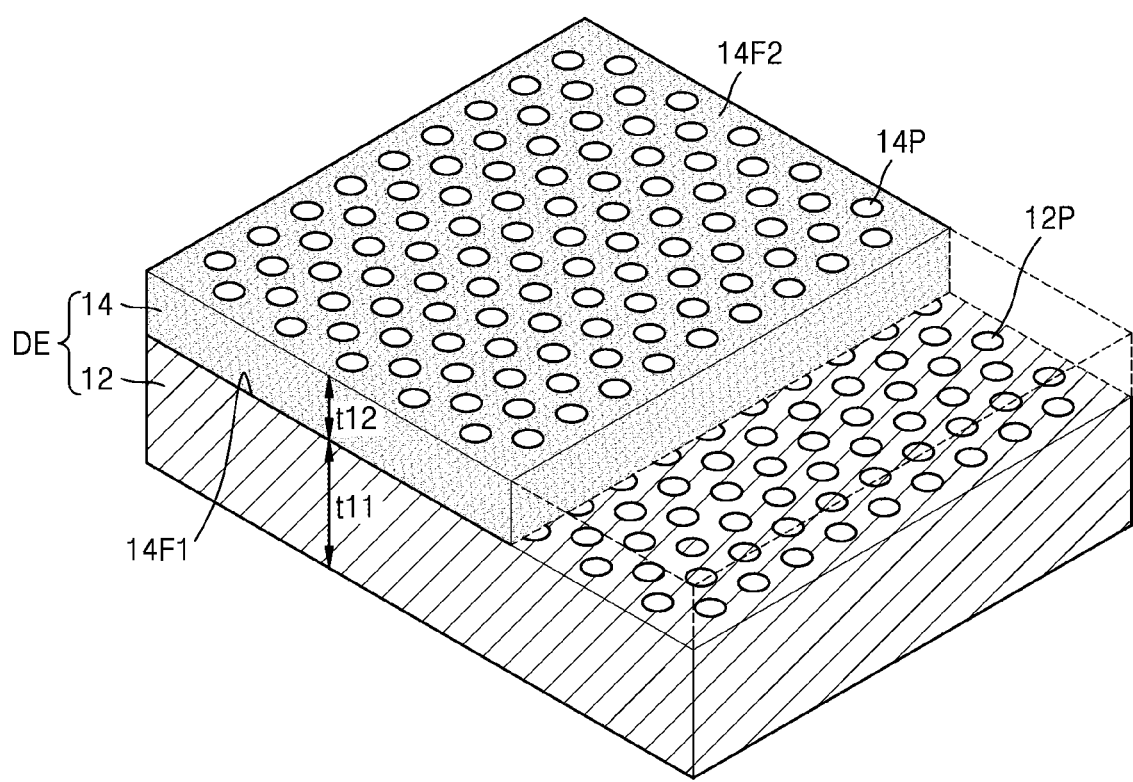
Figure 4B:
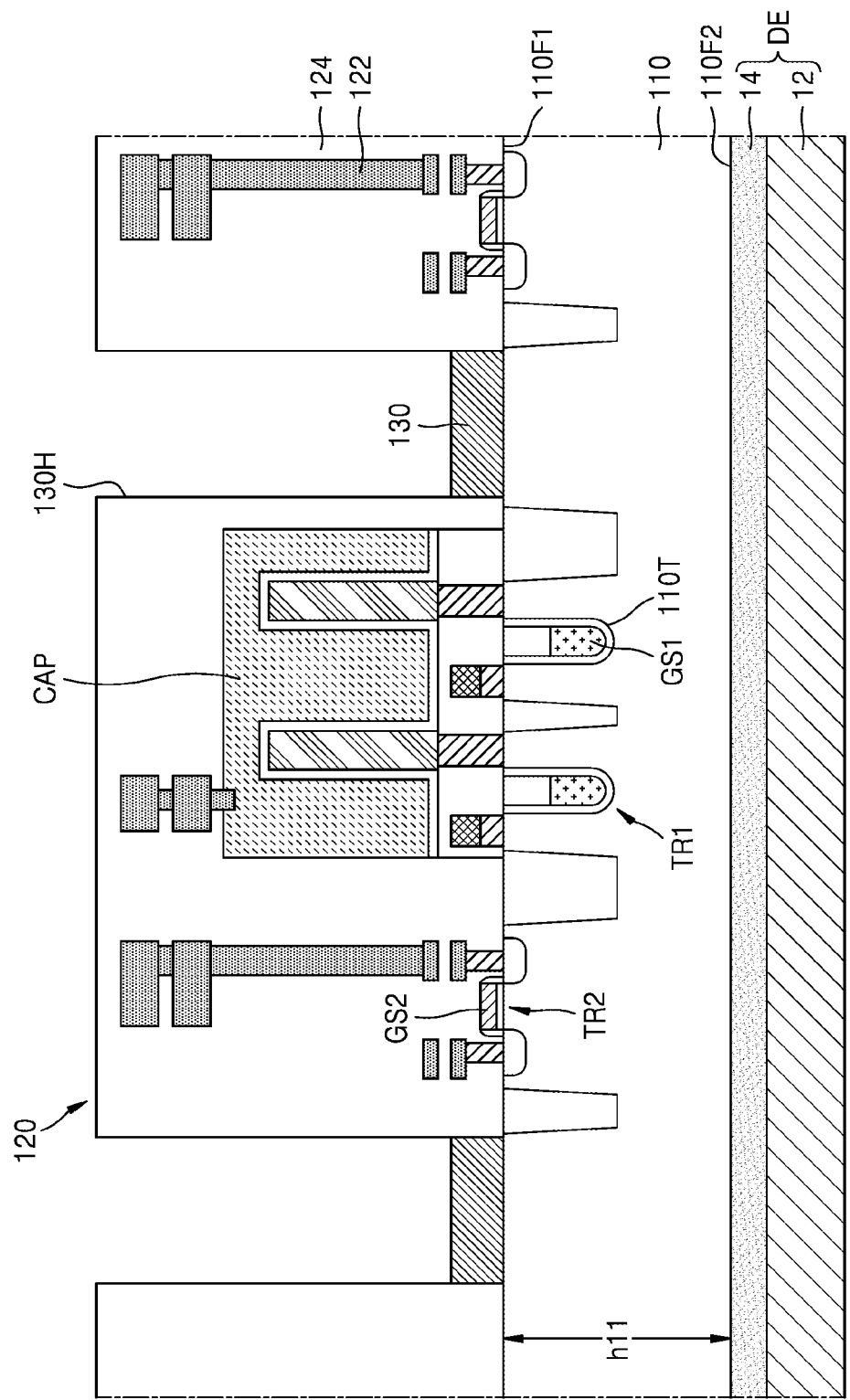

Referring to FIGS. 1, 4A, and 4B, a deuterium exchange structure DE may be attached to the second surface 110F2 of the substrate 110 in operation S130. For example, as illustrated in FIG. 4B, the bias pad 130 and the deuterium exchange structure DE may be on opposite surfaces of the substrate 110.

In example embodiments, as shown in FIG. 4A, the deuterium exchange structure DE may include a porous metal plate 12 and a hydrogen ion exchange membrane 14. For example, the hydrogen ion exchange membrane 14 may be arranged to entirely cover, e.g., overlap, the top surface, e.g., a surface facing the hydrogen ion exchange membrane 14, of the porous metal plate 12.

In example embodiments, the porous metal plate 12 may include a porous palladium plate. However, the porous metal plate 12 may include a transition metal plate having a wide surface area, besides the porous palladium plate. For example, the porous metal plate 12 may include a porous nickel plate or a porous titanium plate.

For example, the porous metal plate 12 may include a plurality of pores 12P, as shown in FIG. 4A. The pores 12P may have a size of several to several hundreds of nanometers and may be randomly arranged. The pores 12P randomly arranged in the porous metal plate 12 may be connected to each other to form a hydrogen-ion transport path between two opposite major surfaces of the porous metal plate 12, e.g., from the bottom surface of the porous metal plate 12 to the top surface of the porous metal plate 12. The porous metal plate 12 may have a relatively large surface area. For example, the porous metal plate 12 may be formed using at least one of a chemical vapor deposition process, a physical vapor deposition process, an electroplating process, an electroless plating process, and a photodeposition process.

In example embodiments, the hydrogen ion exchange membrane 14 may include a polymer having an anion fixed charge. The hydrogen ion exchange membrane 14 may include a polymer membrane including a plurality of pores 14P. For example, the pores 14P may have a size of several to several tens of nanometers and may be aligned in one direction. The pores 14P may function as a deuterium ion channel. In other words, the pores 14P may provide an ion transport path, through which deuterium ions may move from a first surface 14F1 of the hydrogen ion exchange membrane 14 to a second surface 14F2 of the hydrogen ion exchange membrane 14.

In example embodiments, the hydrogen ion exchange membrane 14 may include a perfluorinated compound (PFC). In some embodiments, the hydrogen ion exchange membrane 14 may include at least one of, e.g., tetrafluoroethylene hexafluoropropylene (FEP), perfluoroalkyl alkyl-vinyl-ether (PFA), ethylene-tetrafluoroethylene (ETFE), polyvinylidene fluoride (PVDF), polytetrafluoroethylene (PTFE), polyethylene (PE), polypropylene (PP), polyether ether ketone (PEEK), polyarylsulfone (PSU), polyethersulfone (PES), polyimide (PI), and polybenzimidazole (PBI). In some embodiments, the hydrogen ion exchange membrane 14 may include Nafion®.

For example, the porous metal plate 12 may have a first thickness t11, e.g., of about 5 micrometers to about 30 micrometers. For example, the hydrogen ion exchange membrane 14 may have a second thickness t12, e.g., of about 1 micrometer to about 5 micrometers. For example, as illustrated in FIG. 4A, the first thickness t11 of the porous metal plate 12 may be larger than the second thickness t12 of the hydrogen ion exchange membrane 14 along a direction perpendicular to the first surface 110F1 of the substrate 110.

For example, the deuterium exchange structure DE may be formed by attaching, e.g., bonding, the hydrogen ion exchange membrane 14 to the porous metal plate 12 using a hot press process. As shown in FIG. 4B, the deuterium exchange structure DE may be attached to the second surface 110F2 of the substrate 110 using a hot press process. For example, the deuterium exchange structure DE may be attached to the second surface 110F2 of the substrate 110, such that the hydrogen ion exchange membrane 14 is between the second surface 110F2 of the substrate 110 and the porous metal plate 12.

Figure 5:
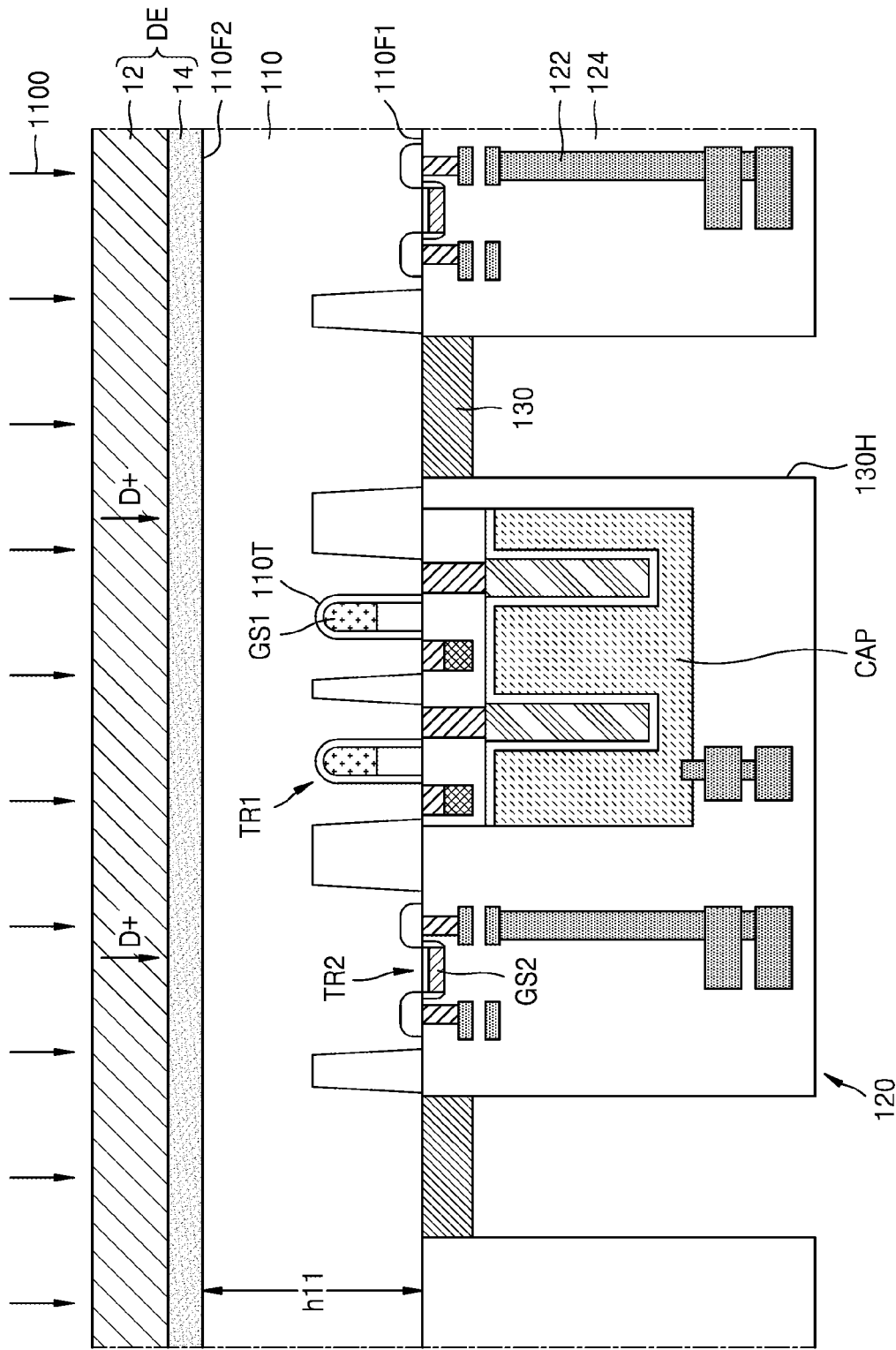

Referring to FIGS. 1 and 5, deuterium may be implanted into the deuterium exchange structure DE using plasma processing 1100 in operation S140. For example, as illustrated in FIG. 5, the deuterium may be implanted directly into the deuterium exchange structure DE, e.g., the plasma processing 1100 may be performed directly on a surface of the porous metal plate 12 facing away from the hydrogen ion exchange membrane 14.

According to example embodiments, the second surface 110F2 of the substrate 110, which has the deuterium exchange structure DE attached thereto, may be located in a chamber, and the plasma processing 1100 may be performed. The plasma processing 1100 may be performed using a non-silane processing gas including deuterium. A carrier gas of the non-silane processing gas may include, e.g., nitrogen ($N_2$), argon (Ar), or helium (He). For example, the plasma processing 1100 may be performed at a temperature of about 250° C. to about 350° C.

Through the plasma processing 1100, deuterium ions $D^+$ may be implanted into the deuterium exchange structure DE, e.g., into the porous metal plate 12. Because the porous metal plate 12 has a relatively large surface area, plasma density may increase during the plasma processing 1100, and accordingly, a content of deuterium ions $D^+$ implanted into the porous metal plate 12 may also increase.

Figure 6:
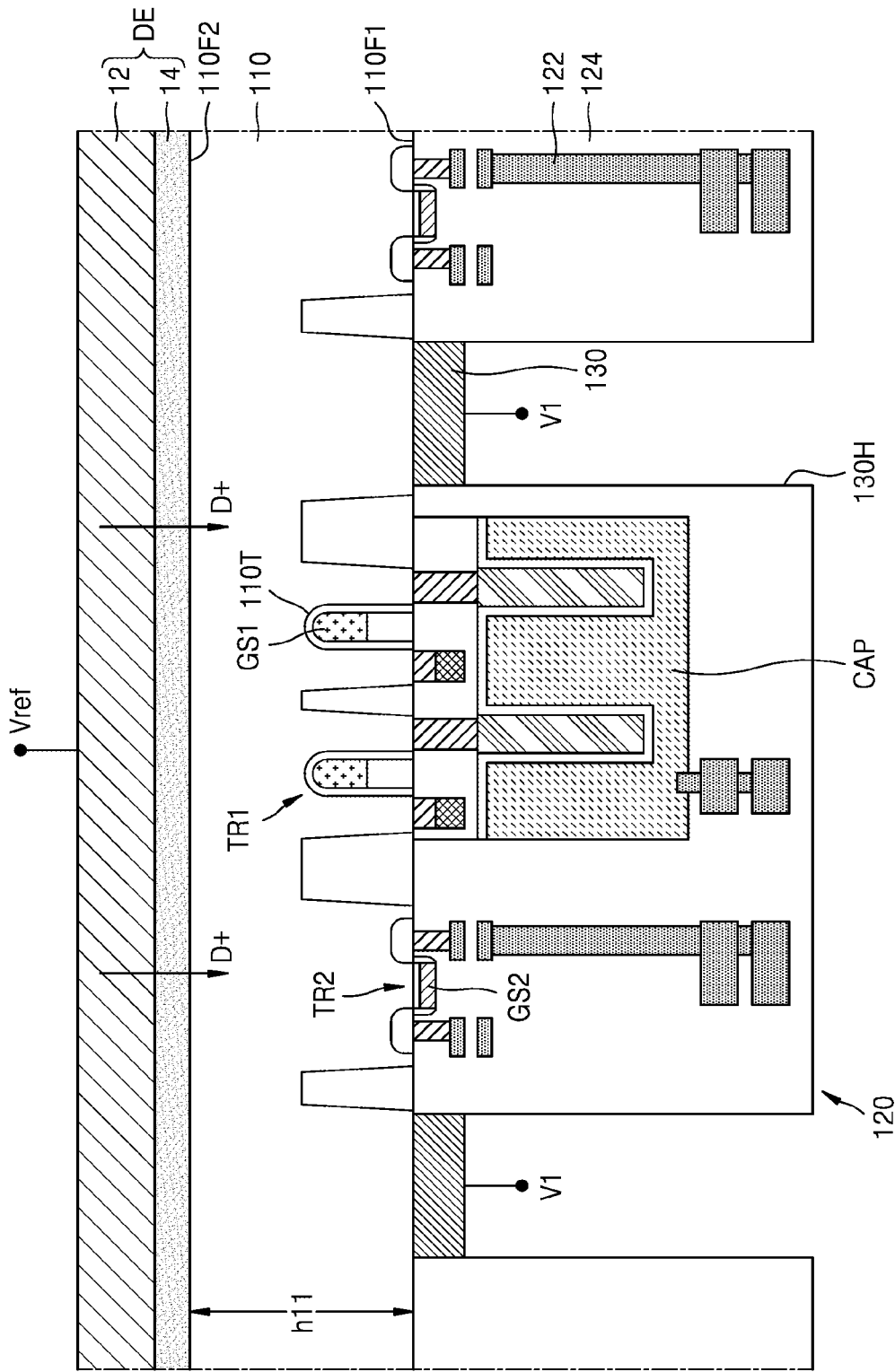

Referring to FIGS. 1 and 6, deuterium may be diffused from the deuterium exchange structure DE into the substrate 110 in operation S150.

In example embodiments, a reference voltage Vref may be applied to the porous metal plate 12, and a first voltage V1 may be applied to the bias pad 130. For example, the reference voltage Vref may be a positive voltage, and the first voltage V1 may be a negative voltage. Accordingly, a negative potential may be applied to the first surface 110F1 of the substrate 110, and a positive potential may be applied to the porous metal plate 12. Accordingly, an electric field may be generated from the first surface 110F1 of the substrate 110 to the second surface 110F2 of the substrate 110, and from the second surface 110F2 of the substrate 110 to the porous metal plate 12.

As the first voltage V1 is applied to the bias pad 130, thereby generating an electric field in the substrate 110, the deuterium ions $D^+$ diffuse from the porous metal plate 12 into the substrate 110 through the hydrogen ion exchange membrane 14 and the second surface 110F2 of the substrate 110. The deuterium ions $D^+$ diffused into the substrate 110 may be combined with a silicon dangling bond in the surface of the trench 110T of the substrate 110, e.g., the border between the substrate 110 and the first or second gate structure GS1 or GS2 (or the interface between the substrate 110 and a gate insulating layer in the first or second gate structure GS1 or GS2), to form a silicon-deuterium bond (an Si-D bond).

According to example embodiments, the bias pads 130 are uniformly distributed in the scribe lane region SR at regular intervals, and accordingly, deuterium may be relatively quickly diffused from the second surface 110F2 of the substrate 110 to the first surface 110F1 of the substrate 110 in all cell regions CR in a plan view. Accordingly, a threshold voltage change and occurrence of leakage current in the first and second transistors TR1 and TR2 included in the circuit blocks 120 arranged in each of the cell regions CR may be decreased. Thereafter, a plurality of semiconductor devices 100 (see FIG. 7) respectively including the cell regions CR may be formed by sawing scribe lane regions SR.

Figure 7:
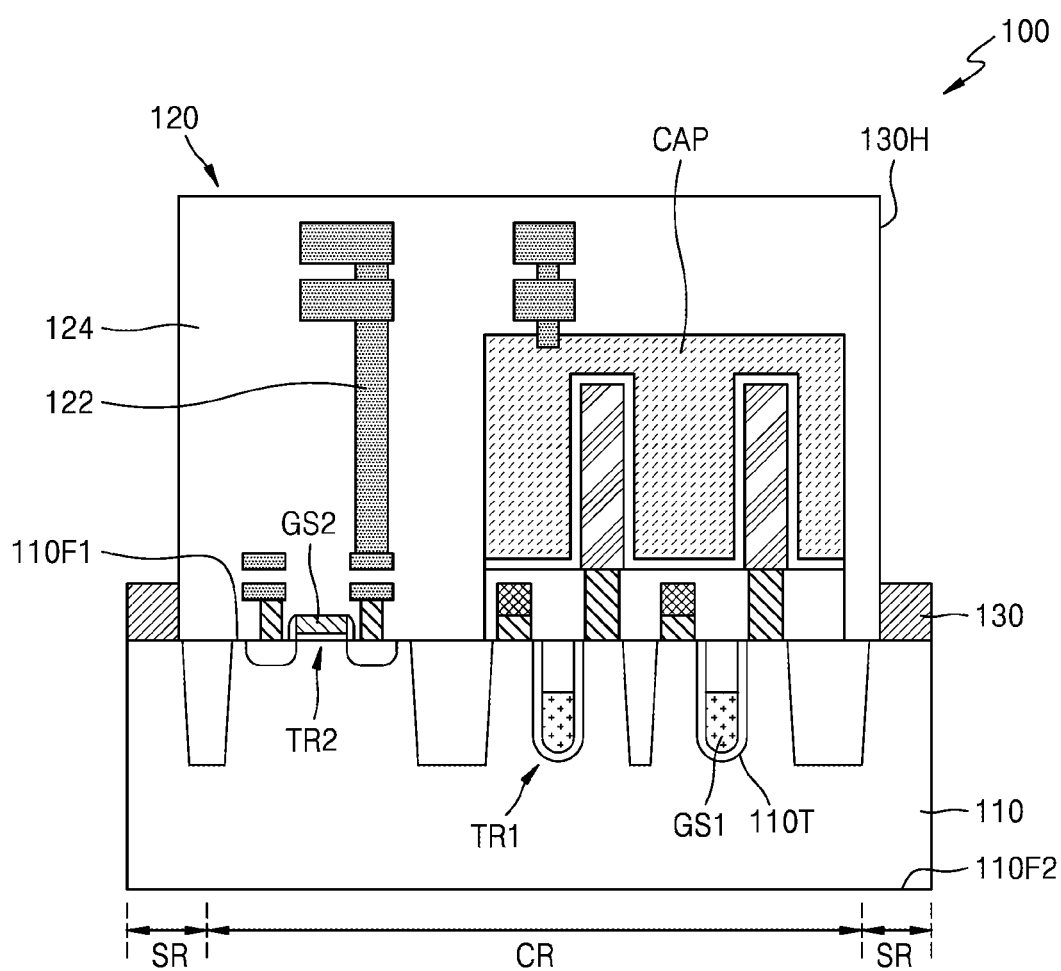
FIG. 7 is a cross-sectional view of a semiconductor device according to example embodiments.
Figure 8:
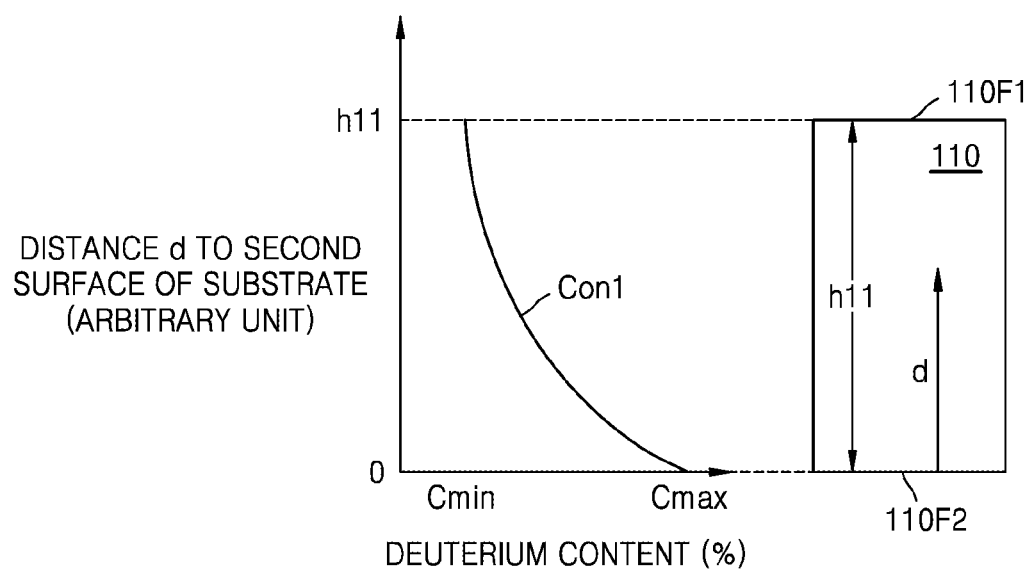
FIG. 8 is a graph schematically showing a first deuterium content in a substrate in FIG. 7.

FIG. 7 is a cross-sectional view of the semiconductor device 100 according to example embodiments. FIG. 8 is a graph schematically showing a first deuterium content Con1 in the substrate 110 in FIG. 7.

Referring to FIGS. 7 and 8, the semiconductor device 100 may include the cell region CR and the scribe lane region SR surrounding the cell region CR. The opening 130H may be in the scribe lane region SR, and the bias pad 130, which is in direct contact with the first surface 110F1 of the substrate 110, may be in the opening 130H.

As shown in FIG. 8, the substrate 110 may have the first deuterium content Con1. For example, the first deuterium content Con1 may have a concentration profile that gradually decreases in the vertical direction from the second surface 110F2 of the substrate 110 to the first surface 110F1 of the substrate 110.

In detail, the first deuterium content Con1 may gradually decrease as a distance "d" from the second surface 110F2 of the substrate 110 increases. For example, when the distance "d" from the second surface 110F2 of the substrate 110 is 0, i.e., at the second surface 110F2 of the substrate 110, the first deuterium content Con1 may have a maximum content value Cmax. When the distance "d" from the second surface 110F2 of the substrate 110 is equal to the first height h11, i.e., at the first surface 110F1 of the substrate 110, the first deuterium content Con1 may have a minimum content value Cmin.

In some embodiments, the first deuterium content Con1 may have a profile that exponentially decreases in the vertical direction from the second surface 110F2 of the substrate 110 to the first surface 110F1 of the substrate 110. In example embodiments, the first deuterium content Con1 may be measured using an analytical tool, e.g., time of flight secondary ion mass spectrometry (TOF-SIMS), Rutherford backscattering spectrometry (RBS), or Fourier transform infrared spectroscopy (FTIR).

The semiconductor device 100 described with reference to FIGS. 7 and 8 may be completely formed by performing the method described with reference to FIGS. 1 to 6. The semiconductor device 100 may include deuterium that has been implanted from the second surface 110F2 of the substrate 110 using the deuterium exchange structure DE. Accordingly, a dangling bond on the surface of the substrate 110 may be substituted with a Si-D bond, and a threshold voltage change or occurrence of leakage current in the first and second transistors TR1 and TR2 may be decreased or prevented. Therefore, the semiconductor device 100 may have high electrical performance.

In a method of manufacturing a semiconductor device according to a comparative example, after the wiring layer and the insulating layer are formed above the first surface of the substrate, deuterium may be implanted from above the insulating layer using plasma processing, and annealing (rather than voltage application) may be performed to diffuse the deuterium to the first surface of the substrate. During the annealing, stress-induced migration of aluminum atoms, which are partially included in the wiring layer, may occur, thereby potentially forming voids in the wiring layer and causing a chip failure.

In contrast, according to example embodiments, the bias pad 130 may be formed on the first surface 110F1 of the substrate 110, and deuterium may be implanted from the deuterium exchange structure DE attached to the second surface 110F2 of the substrate 110. Deuterium may be diffused into the substrate 110 (e.g., to the first surface 110F1 of the substrate 110) by an electric field in a thickness direction of the substrate 110 (i.e., a direction perpendicular to the first surface 110F1 of the substrate 110), thereby preventing voids from being formed in the wiring layer 122.

Figure 9:
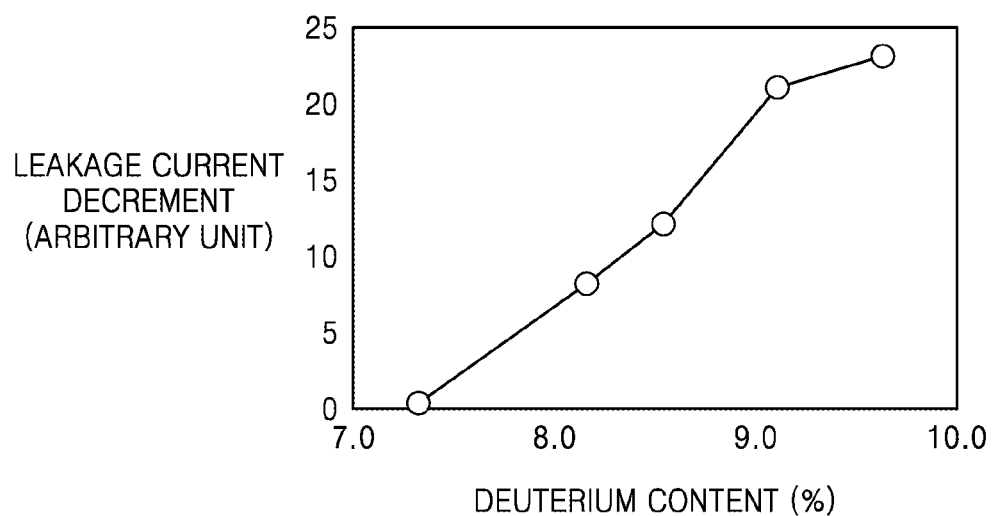
FIG. 9 is a graph showing, as a function of a deuterium content, a leakage current decrement in a semiconductor device according to example embodiments.

FIG. 9 is a graph showing, as a function of a deuterium content, a leakage current decrement in a semiconductor device according to example embodiments.

Referring to FIG. 9, a deuterium content at the surface of a substrate of the semiconductor device is measured using FTIR. For example, a leakage current decrement of the first transistor TR1 of the semiconductor device 100 of FIG. 7 is obtained. It may be seen that leakage current in the semiconductor device decreases more as a content of deuterium implanted into the substrate of the semiconductor device increases.

Figure 10:
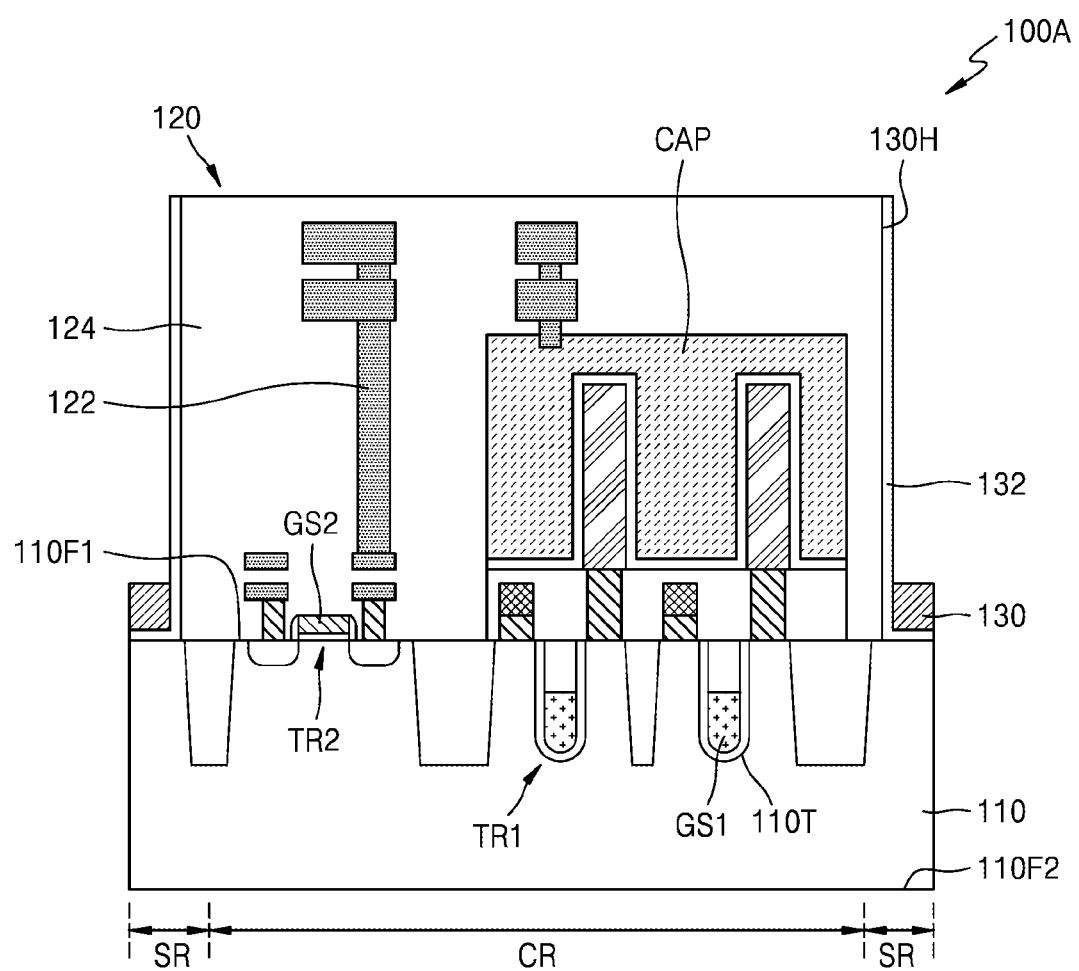
FIG. 10 is a cross-sectional view of a semiconductor device according to example embodiments.

FIG. 10 is a cross-sectional view of a semiconductor device 100A according to example embodiments. In FIGS. 1 to 10, like reference characters denote like elements.

Referring to FIG. 10, the semiconductor device 100A may include an insulating layer 132 in the scribe lane region SR of the substrate 110, and the bias pad 130 on the insulating layer 132. That is, the insulating layer 132 may be between the bias pad 130 and the substrate 110.

In detail, the insulating layer 132 may be conformally formed on the inner wall of the opening 130H to cover the first surface 110F1 of the substrate 110, wherein the insulating layer 132 may be relatively thin. The bias pad 130 may be on the insulating layer 132, and thus, not be in direct contact with the first surface 110F1 of the substrate 110. The insulating layer 132 may be relatively thin having a thickness of about several angstroms to several tens of angstroms, and accordingly, an electric field may be applied to a portion of the substrate 110 below the bias pad 130 due to a first voltage applied to the bias pad 130.

Figure 11:
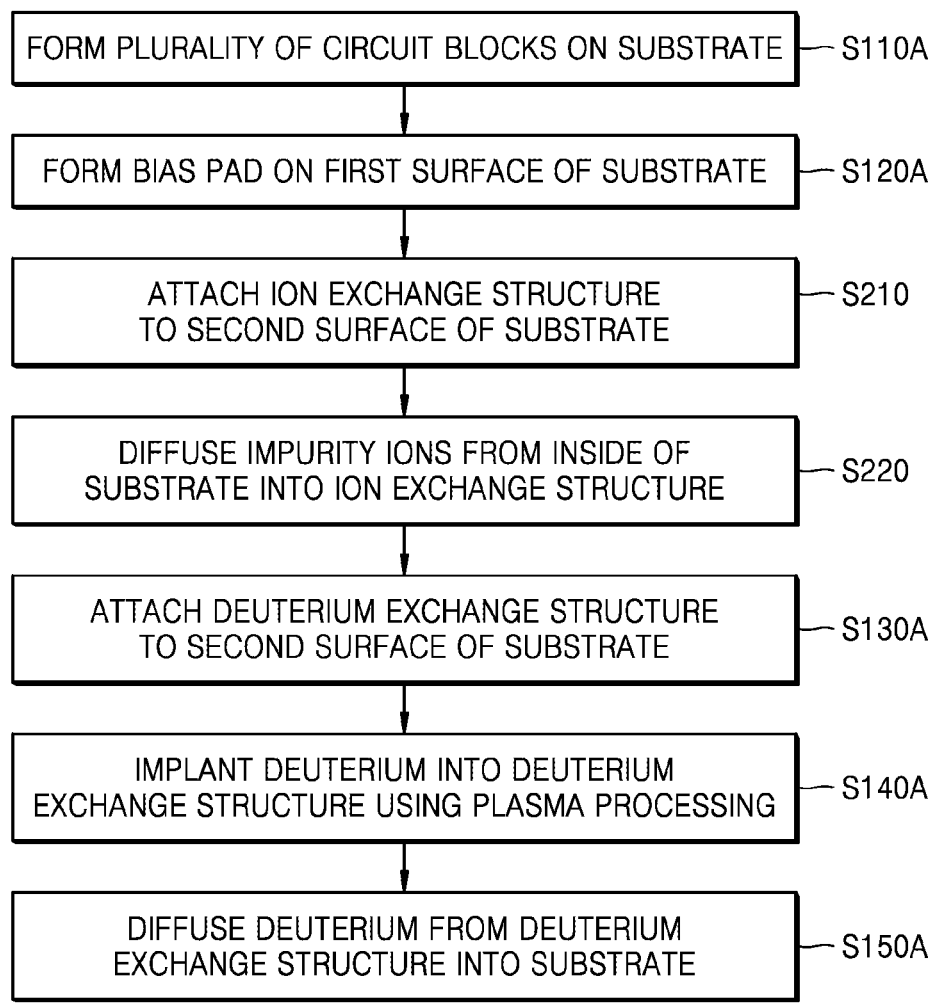
FIG. 11 is a flowchart of a method of manufacturing a semiconductor device, according to example embodiments.

FIG. 11 is a flowchart of a method of manufacturing a semiconductor device, according to example embodiments. FIGS. 12A, 12B, 13A, and 13B are schematic diagrams of stages in the method of FIG. 11. In FIGS. 1 to 13B, like reference characters denote like elements.

Referring to FIGS. 11 and 2A-2B, the plurality of circuit blocks 120 may be formed on the substrate 110 in operation S110A. The circuit blocks 120 may be formed on the first surface 110F1 of the substrate 110 in the cell regions CR, e.g., in a one-to-one correspondence. The circuit blocks 120 may include the first and second transistors TR1 and TR2 on the first surface 110F1 of the substrate 110, the capacitor CAP, the wiring layer 122, and the insulating layer 124.

Referring to FIGS. 11 and 3A-3B, the bias pads 130 may be formed on the first surface 110F1 of the substrate 110 in operation 5120A. The bias pads 130 may be arranged in the scribe lane region SR and/or the edge region ER of the substrate 110. For example, the bias pads 130 may be directly arranged on the first surface 110F1 of the substrate 110. In a plan view, the bias pads 130 may be uniformly distributed in the scribe lane region SR to be spaced apart from each other by a certain distance. For example, a plurality of the bias pads 130 may be arranged around the cell region CR at regular intervals in the plan view.

Figure 12A:
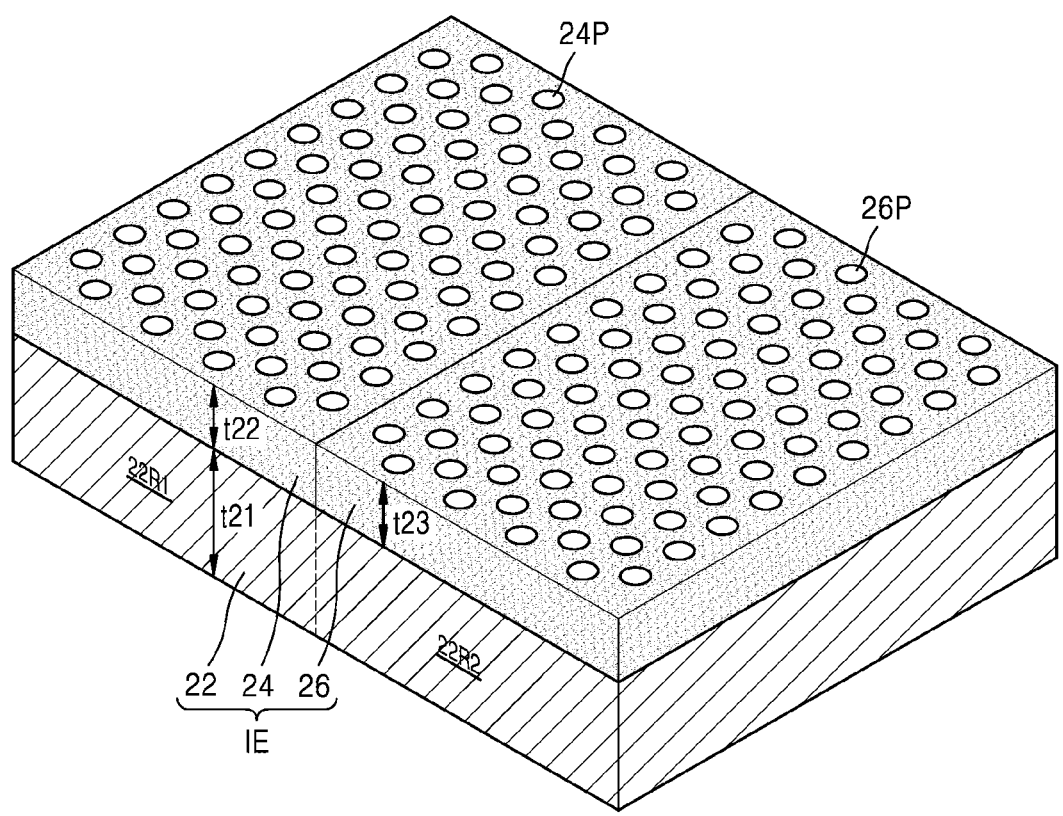
FIGS. 12A, 12B, 13A, and 13B are schematic diagrams of stages in the method of FIG. 11.
Figure 12B:
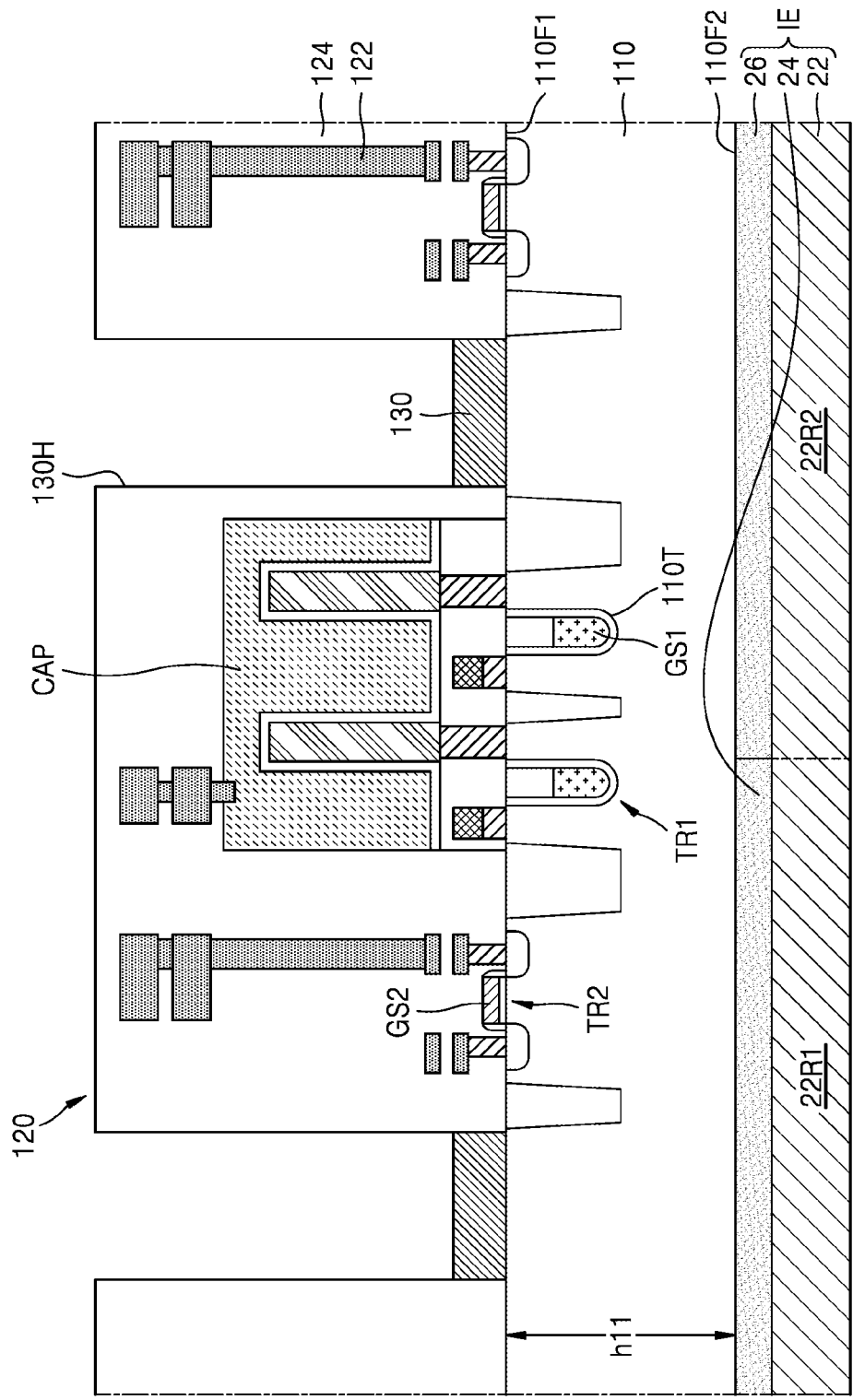

Referring to FIGS. 11, 12A, and 12B, an ion exchange structure IE may be attached to the second surface 110F2 of the substrate 110 in operation S210.

Referring to FIG. 12A, the ion exchange structure IE may include a metal plate 22, a cation exchange membrane 24, and an anion exchange membrane 26. Both the cation exchange membrane 24 and the anion exchange membrane 26 may be on the metal plate 22, e.g., each of the cation exchange membrane 24 and the anion exchange membrane 26 may be directly on the metal plate 22. For example, the metal plate 22 may include a first region 22R1 and a second region 22R2. The cation exchange membrane 24 may be on the first region 22R1 of the metal plate 22, and the anion exchange membrane 26 may be on the second region 22R2 of the metal plate 22. For example, as illustrated in FIG. 12A, facing lateral side surfaces of the cation exchange membrane 24 and the anion exchange membrane 26 may be in direct contact with each other.

In example embodiments, the metal plate 22 may include, e.g., a palladium plate, a nickel plate, or a titanium plate. The cation exchange membrane 24 may include a polymer having an anion fixed charge. The cation exchange membrane 24 may include negatively charged groups fixed therein, and the negatively charged groups may include at least one of, e.g., $SO_3^-$, $COO^-$, $PO_3^{2-}$, $PO_3H^-$, and $C_6H_4O^-$. The cation exchange membrane 24 may include a plurality of pores 24P, which may function as a cation channel. The negatively charged groups may allow the transport of cations through the pores 24P. The anion exchange membrane 26 may include a polymer having a cation fixed charge. The anion exchange membrane 26 may include positively charged groups fixed therein, and the positively charged groups may include at least one of, e.g., $NH_3^+$, $NRH_2^+$, $NR_2H^+$, $NR_3^+$, and $PR^{3+}$ (where R is hydrocarbon). The anion exchange membrane 26 may include a plurality of pores 26P, which may function as an anion channel. The positively charged groups may allow the transport of anions through the pores 26P.

For example, the metal plate 22 may have a first thickness t21 of about 5 micrometers to about 30 micrometers, the cation exchange membrane 24 may have a second thickness t22 of about 1 micrometer to about 5 micrometers, and the anion exchange membrane 26 may have a third thickness t23 of about 1 micrometer to about 5 micrometers. For example, as illustrated in FIG. 12A, the second thickness t22 and the third thickness t23 may equal each other, and the first thickness t21 may be larger than each of the second and third thickness t22 and t23.

For example, the ion exchange structure IE may be formed by attaching the cation exchange membrane 24 to the first region 22R1 of the metal plate 22 and the anion exchange membrane 26 to the second region 22R2 of the metal plate 22, using a hot press process. The ion exchange structure IE may be attached to the second surface 110F2 of the substrate 110 using a hot press process. For example, referring to FIG. 12B, the ion exchange structure IE may be attached to the second surface 110F2 of the substrate 110, such that the cation exchange membrane 24 is between the first region 22R1 of the metal plate 22 and the second surface 110F2 of the substrate 110, and the anion exchange membrane 26 is between the second region 22R2 of the metal plate 22 and the second surface 110F2 of the substrate 110.

Figure 13A:
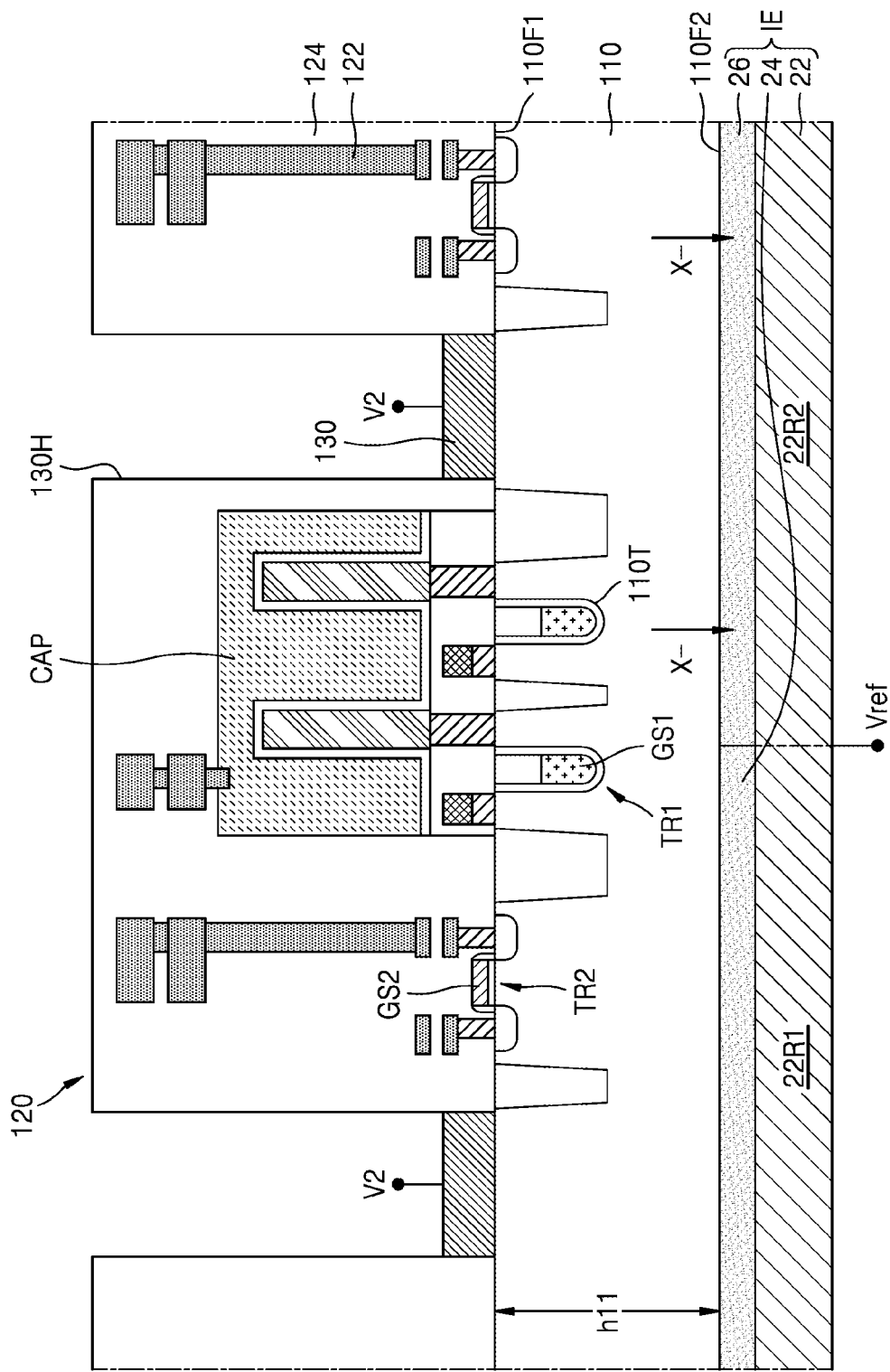
Figure 13B:
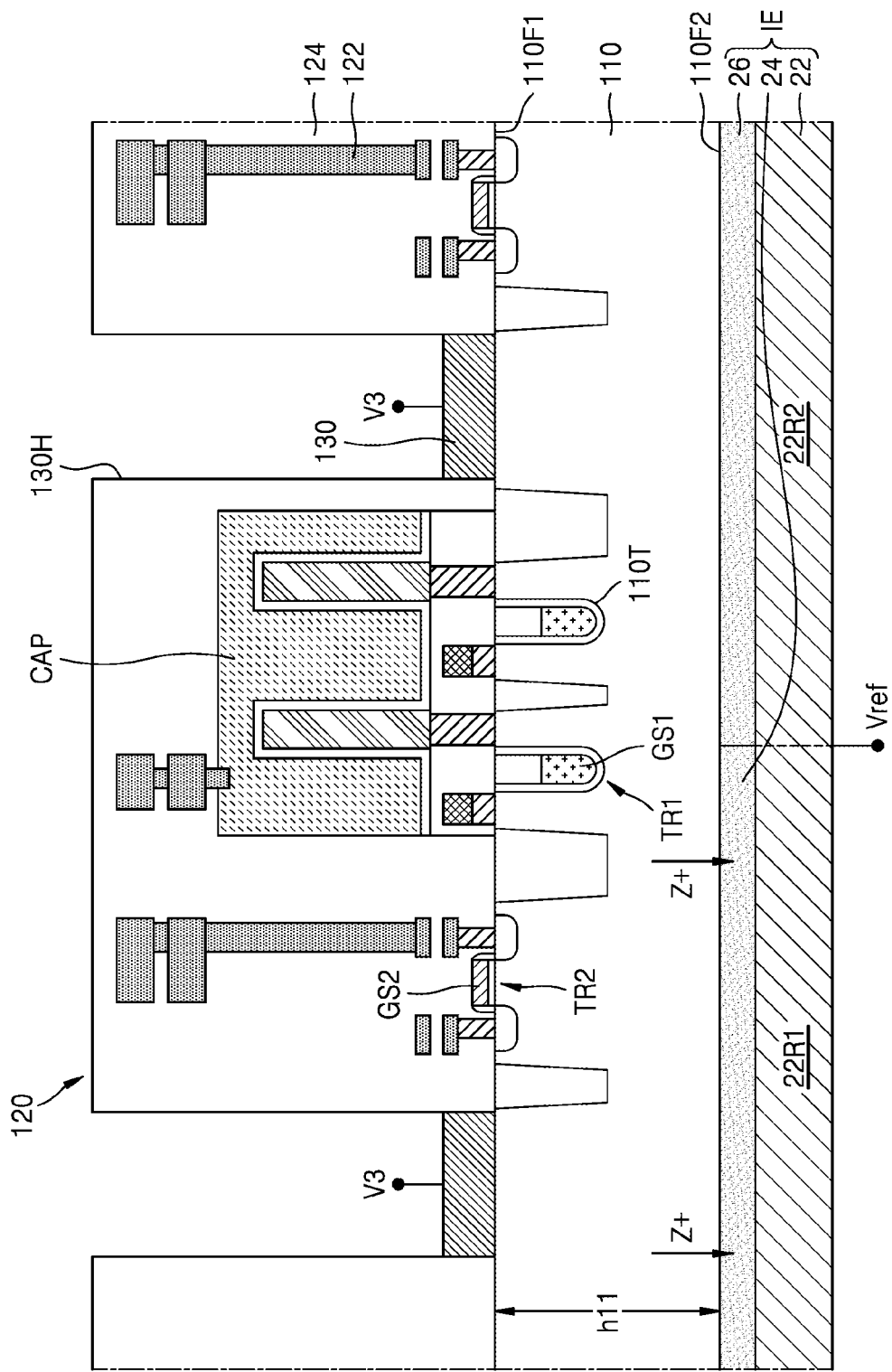

Referring to FIGS. 11, 13A, and 13B, impurity ions may be diffused from the inside of the substrate 110 into the ion exchange structure IE in operation S220. In example embodiments, operation S220 may sequentially include a first sub operation of diffusing anions $X^-$ from the inside of the substrate 110 into the ion exchange structure IE, and a second sub operation of diffusing cations $Z^+$ from the inside of the substrate 110 into the ion exchange structure IE.

In detail, in the first sub operation, as shown in FIG. 13A, the reference voltage Vref may be applied to the metal plate 22, and a second voltage V2 may be applied to the bias pad 130. For example, the reference voltage Vref may be a positive voltage, and the second voltage V2 may be a negative voltage. Accordingly, a negative potential is applied to the first surface 110F1 of the substrate 110, and a positive potential is applied to the metal plate 22, and accordingly, an electric field is generated from the first surface 110F1 of the substrate 110 to the second surface 110F2 of the substrate 110, and from the second surface 110F2 of the substrate 110 to the metal plate 22.

As the second voltage V2 is applied to the bias pad 130 and the electric field is generated in the substrate 110, the anions $X^-$ are diffused from the inside of the substrate 110 to the metal plate 22 through the second surface 110F2 of the substrate 110 and the anion exchange membrane 26. That is, anions $X^-$ of undesirable impurities in the substrate 110 may be diffused to the anion exchange membrane 26 and thus removed from the substrate 110.

In the second sub operation, as shown in FIG. 13B, the reference voltage Vref may be applied to the metal plate 22, and a third voltage V3 may be applied to the bias pad 130. In some embodiments, the reference voltage Vref may be a negative voltage, and the third voltage V3 may be a positive voltage. In some embodiments, the reference voltage Vref may be a positive voltage, and the third voltage V3 may be a positive voltage that is greater than the reference voltage Vref. Accordingly, a positive potential is applied to the first surface 110F1 of the substrate 110, and a negative potential is applied to the metal plate 22. Accordingly, an electric field may be generated from the first surface 110F1 of the substrate 110 to the second surface 110F2 of the substrate 110, and from the second surface 110F2 of the substrate 110 to the metal plate 22.

As the third voltage V3 is applied to the bias pad 130 and the electric field is generated in the substrate 110, cations $Z^+$ may be diffused from the inside of the substrate 110 to the metal plate 22 through the second surface 110F2 of the substrate 110 and the cation exchange membrane 24. That is, cations $Z^+$ of undesirable impurities in the substrate 110 may be diffused to the cation exchange membrane 24 and thus removed from the substrate 110.

In example embodiments, operation S220 may sequentially include the second sub operation of diffusing the cations $Z^+$ from the inside of the substrate 110 into the ion exchange structure IE and the first sub operation of diffusing the anions $X^-$ from the inside of the substrate 110 into the ion exchange structure IE. In example embodiments, the first sub operation of diffusing the anions $X^-$ from the inside of the substrate 110 into the ion exchange structure IE and the second sub operation of diffusing the cations $Z^+$ from the inside of the substrate 110 into the ion exchange structure IE may be sequentially and repeatedly performed. For example, the first and second sub operations may be performed sequentially in any convenient order.

According to example embodiments, the bias pads 130 are uniformly distributed in the scribe lane region SR at regular intervals, and accordingly, the cations $Z^+$ and the anions $X^-$ may be relatively quickly diffused from the first surface 110F1 of the substrate 110 or the inside of the substrate 110 to the second surface 110F2 of the substrate 110 in all cell regions CR in a plan view. Accordingly, a threshold voltage change and occurrence of leakage current in the first and second transistors TR1 and TR2 included in the circuit blocks 120 arranged in each of the cell regions CR may be decreased.

Thereafter, the ion exchange structure IE may be removed from the second surface 110F2 of the substrate 110. In example embodiments, the ion exchange structure IE may be removed using an oxygen plasma ashing process.

Referring to FIGS. 11, 4A, and 4B, the deuterium exchange structure DE may be attached to the second surface 110F2 of the substrate 110 in operation 5130A. The deuterium exchange structure DE may include the porous metal plate 12 and the hydrogen ion exchange membrane 14. The deuterium exchange structure DE may be attached to the second surface 110F2 of the substrate 110 using a hot press process. For example, the deuterium exchange structure DE may be attached to the second surface 110F2 of the substrate 110, such that the hydrogen ion exchange membrane 14 is between the second surface 110F2 of the substrate 110 and the porous metal plate 12.

Referring to FIGS. 11 and 5, deuterium may be implanted into the deuterium exchange structure DE using the plasma processing 1100 in operation 5140A. Through the plasma processing 1100, deuterium may be implanted into the deuterium exchange structure DE, e.g., into the porous metal plate 12. Because the porous metal plate 12 has a relatively large surface area, plasma density may increase during the plasma processing 1100, and accordingly, a content of deuterium ions implanted into the porous metal plate 12 may also increase.

Referring to FIGS. 11 and 6, deuterium may be diffused from the deuterium exchange structure DE into the substrate 110 in operation 5150A. In example embodiments, the reference voltage Vref may be applied to the porous metal plate 12, and the first voltage V1 may be applied to the bias pad 130. As the first voltage V1 is applied to the bias pad 130 and an electric field is generated in the substrate 110, the deuterium may be diffused from the porous metal plate 12 into the substrate 110 through the hydrogen ion exchange membrane 14 and the second surface 110F2 of the substrate 110. Thereafter, a plurality of the semiconductor devices 100 (see FIG. 7) respectively including the cell regions CR may be formed by sawing the scribe lane regions SR.

By way of summation and review, as threshold voltage change or leakage current may occur in down-scaled transistors, a method of performing a hydrogen treating process on a semiconductor device has been suggested. Therefore, embodiments provide a method of manufacturing a semiconductor device, by which a substrate defect is prevented by using deuterium implantation, and a semiconductor device manufactured using the method.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:

preparing a substrate including cell regions and a scribe lane region;

forming circuit blocks in the cell regions of the substrate, the substrate including a first surface and a second surface;

forming a bias pad on the first surface of the substrate, such that the bias pad is in the scribe lane region of the substrate;

bonding a deuterium exchange structure to the second surface of the substrate;

implanting deuterium into the deuterium exchange structure using plasma processing; and applying a first voltage to the bias pad, such that the deuterium is diffused from the deuterium exchange structure into the substrate through the second surface of the substrate.

2. The method as claimed in claim 1, wherein the deuterium exchange structure is formed of a porous metal plate and a hydrogen ion exchange membrane on the porous metal plate.

3. The method as claimed in claim 2, wherein the porous metal plate is formed of a porous palladium plate.

4. The method as claimed in claim 2, wherein the hydrogen ion exchange membrane is formed of a perfluorinated compound.

5. The method as claimed in claim 2, wherein bonding the deuterium exchange structure to the second surface of the substrate includes using a hot press process, such that the hydrogen ion exchange membrane is attached to the second surface of the substrate.

6. The method as claimed in claim 1, further comprising, after the deuterium is diffused from the deuterium exchange structure into the substrate, removing the deuterium exchange structure from the second surface of the substrate.

7. The method as claimed in claim 1, further comprising, before bonding the deuterium exchange structure to the second surface of the substrate:

bonding an ion exchange structure to the second surface of the substrate;

applying a second voltage to the bias pad, such that impurities diffuse from the second surface of the substrate into the ion exchange structure; and removing the ion exchange structure from the substrate.

8. The method as claimed in claim 7, wherein the ion exchange structure is formed of:

a metal plate including a first region and a second region;

a cation exchange membrane on the first region of the metal plate; and an anion exchange membrane on the second region of the metal plate.

9. The method as claimed in claim 8, wherein the cation exchange membrane includes a polymer having an anion fixed charge, and the anion exchange membrane includes a polymer having a cation fixed charge.

10. The method as claimed in claim 9, wherein the anion fixed charge includes at least one of $SO_3^-$, $COO^-$, $PO_3^{2-}$, $PO_3H^-$, and $C_6H_4O^-$, and the cation fixed charge includes at least one of $NH_3^+$, $NRH_2^+$, $NR_3H^+$, $NR^{3+}$, and $PR^{3+}$, where R is hydrocarbon.

11. The method as claimed in claim 1, wherein applying the first voltage to the bias pad to have the deuterium diffuse into the substrate includes diffusing a first deuterium content into the substrate, such that the first deuterium content in a first portion of the substrate adjacent to the second surface of the substrate is greater than a second deuterium content in a second portion of the substrate adjacent to the first surface of the substrate.

12. The method as claimed in claim 1, wherein forming the bias pad includes forming the bias pad directly in direct contact with the first surface of the substrate in the scribe lane region.

13. The method as claimed in claim 1, wherein forming the bias pad includes:
   forming an insulating layer on the first surface of the substrate in the scribe lane region, such that the insulating layer has a first thickness; and
   forming the bias pad on the insulating layer, such that the insulating layer is between the bias pad and the first surface of the substrate.

14. A method of manufacturing a semiconductor device, the method comprising:
   forming circuit blocks on a substrate, the substrate including a first surface and a second surface;
   forming a bias pad on the first surface of the substrate;
   bonding a deuterium exchange structure to the second surface of the substrate, the deuterium exchange structure including a porous metal plate and a hydrogen ion exchange membrane on a top surface of the porous metal plate;
   implanting deuterium into the deuterium exchange structure using plasma processing; and
   diffusing the deuterium from the deuterium exchange structure into the substrate through the second surface of the substrate by applying a first voltage to the bias pad.

15. The method as claimed in claim 14, wherein bonding the deuterium exchange structure to the second surface of the substrate includes using a hot press process, such that the hydrogen ion exchange membrane is attached to the second surface of the substrate.

16. The method as claimed in claim 14, wherein diffusing the deuterium into the substrate includes diffusing a first deuterium content into the substrate, such that the first deuterium content in a first portion of the substrate adjacent to the second surface of the substrate is greater than a second deuterium content in a second portion of the substrate adjacent to the first surface of the substrate.

17. The method as claimed in claim 14, further comprising, before bonding the deuterium exchange structure to the second surface of the substrate:
   bonding an ion exchange structure to the second surface of the substrate, the ion exchange structure including a metal plate having a first region and a second region, a cation exchange membrane on the first region, and an anion exchange membrane on the second region; and
   diffusing impurities from the second surface of the substrate into the ion exchange structure by applying a second voltage to the bias pad.

18. The method as claimed in claim 14, wherein forming the bias pad includes forming the bias pad in direct contact with the first surface of the substrate.

19. The method as claimed in claim 14, wherein forming the bias pad includes:
   forming an insulating layer on the first surface of the substrate, such that the insulating layer has a first thickness; and
   forming the bias pad on the insulating layer, such that the insulating layer is between the bias pad and the first surface of the substrate.

20. A method of manufacturing a semiconductor device, the method comprising:
   forming circuit blocks on a substrate, the substrate including a first surface and a second surface;
   forming a bias pad on the first surface of the substrate;
   bonding an ion exchange structure to the second surface of the substrate;
   diffusing impurities in the substrate from the second surface of the substrate into the ion exchange structure;
   removing the ion exchange structure;
   bonding a deuterium exchange structure to the second surface of the substrate;
   implanting deuterium into the deuterium exchange structure using plasma processing; and
   diffusing the deuterium from the deuterium exchange structure into the substrate through the second surface of the substrate.

* * * * *